United States Patent
Lauffer et al.

[11] Patent Number: 6,156,221
[45] Date of Patent: Dec. 5, 2000

[54] COPPER ETCHING COMPOSITIONS, PROCESSES AND PRODUCTS DERIVED THEREFROM

[75] Inventors: John M. Lauffer, Waverly; Kathleen L. Covert, deceased, late of Binghamton, by Kelly Hawley, executrix; Peter A. Moschak, Chenango Forks, all of N.Y.

[73] Assignee: International Business Machines Corporation, Armonk, N.Y.

[21] Appl. No.: 09/165,957

[22] Filed: Oct. 2, 1998

[51] Int. Cl.$^7$ ............................. B44C 1/22; C09K 13/00
[52] U.S. Cl. ........................... 216/105; 216/13; 216/106; 252/79.5
[58] Field of Search ........................... 216/105, 13, 106; 252/79.5

[56] References Cited

U.S. PATENT DOCUMENTS

| | | |
|---|---|---|
| 3,269,881 | 8/1966 | Alderuccio et al. . |
| 3,644,155 | 2/1972 | Hogya et al. ........................... 216/106 |
| 4,130,455 | 12/1978 | Elias et al. . |
| 4,378,270 | 3/1983 | Brasch . |
| 4,497,687 | 2/1985 | Nelson . |
| 4,545,850 | 10/1985 | Nelson . |
| 4,695,348 | 9/1987 | Battey et al. . |
| 5,244,539 | 9/1993 | McGrath et al. ........................... 216/13 |
| 5,409,567 | 4/1995 | Lytle et al. . |
| 5,855,805 | 1/1999 | Arabinick ............................... 216/106 |
| 5,965,036 | 10/1999 | Maki et al. ............................... 216/106 |

OTHER PUBLICATIONS

Surface Treatment of Metals with Peroxygen Compounds; Plating p. 561 (1955).
Phosphate Coating of Metal Surfaces for Industrial Use. Plating, p. 742 (1955).

*Primary Examiner*—Randy Gulakowski
*Assistant Examiner*—Shamim Ahmed
*Attorney, Agent, or Firm*—Salzman & Levy; Lawrence R. Fraley

[57] ABSTRACT

The present invention is a persulfate etchant composition especially useful for dissolving copper during fabrication of microelectronic packages. The etchant is characterized by its ability to selectively etch copper in the presence of nickel, nickel-phosphorous and noble metal alloys therefrom. Furthermore, no deleterious galvanic etching occurs in this etchant-substrate system so that substantially no undercutting of the copper occurs. The combination of high selectivity and no undercutting allows for a simplification of the microelectronic fabrication process and significant improvements in the design features of the microelectronic package, in particular higher density circuits. The persulfate etchant composition is stabilized with acid and phosphate salts to provide a process that is stable, fast acting, environmentally acceptable, has high capacity, and can be performed at room temperature. A preferred etchant composition is 230 gm/liter sodium persulfate, 3 volume % phosphoric acid and 0.058 molar sodium phosphate dibasic.

20 Claims, No Drawings

COPPER ETCHING COMPOSITIONS, PROCESSES AND PRODUCTS DERIVED THEREFROM

FIELD OF THE INVENTION

This invention pertains generally to the etching of copper during the fabrication of microelectronic packages and, more particularly, to copper etching compositions, processes and various components derived therefrom.

BACKGROUND OF THE INVENTION

At the present time, most chemical etching of copper on microelectronic substrates is performed with either copper or ferric chlorides, chromium salts, alkaline-ammonia, hydrogen peroxide-sulfuric acid or nitric acid compositions. Each of these compositions has certain limitations and disadvantages as described hereinbelow.

The metal etchants, in particular the chromium salts, create a deleterious environmental impact. It is also known that chromium salts are human carcinogens; therefore, their use and disposal are especially problematic.

Nitric acid, either alone or in combination with sulfuric acid or copper nitrate, has been reported by Battey (U.S. Pat. No. 4,695,348) to be useful for etching copper in circuit boards. However, nitrogous oxide gas is a byproduct of this process. Moreover, the process provides anisotropic etching only for certain orientations of copper (i.e., the top surface of the copper crystal structure must have a Miller index of (111) and (200) orientation). This requires first sputtering copper and then electrodepositing more copper. In lieu of sputtered copper, evaporative deposition or electroless deposition is also possible.

The alkaline-ammonia compositions are used commercially because they are relatively fast, have substantial copper-carrying capacity and are reasonably tolerant of some metal resists and some dry film resists. However, these same compositions have poor selectivity for copper versus other metals and alloys. Significant process control is required to achieve acceptable selectivity. It is also known that these compositions may not work well with fine line copper geometries. Furthermore, the dissolved copper is difficult to recover. Also, fumes from the ammonia composition present worker exposure concerns.

The hydrogen peroxide-sulfuric acid compositions used in copper etching processes are very clean to operate and can be recycled. However, these same compositions have relatively slow etching rates and require substantial cooling for stability control due to the autodecomposition reaction of the hydrogen peroxide. Additionally, both the performance of the process and the decomposition of the peroxide are very sensitive to trace impurities via homo- or hetero-catalysis. Stabilizers are necessary for peak performance but these are metal specific. Brasch (U.S. Pat. No. 4,378,270) teaches phenol-sulfonic acid for copper containing solutions. It is also known from Alderuccio, et al (U.S. Pat. No. 3,269,881) that these compositions are adversely affected by chloride or bromide ion at levels of 2 mg/liter, causing reduced etch rates. Elias (U.S. Pat. No. 4,130,455) teaches that the addition of sodium or potassium thiosulfate can counteract this effect.

But use of these additives does not address the basic problem of the catalytic decomposition of the peroxide discussed hereinabove. This decomposition has two important: implications: firstly, the depletion of the peroxide in the etchant solution reduces the etchant rate; and secondly, there is potential for uncontrolled decomposition of large volumes of high temperature solutions, generating high concentrations of oxygen and increasing the safety risks therefrom. Because decomposition of the peroxide is accelerated at elevated temperatures, processing temperatures must be kept low. This adversely affects the rate of the etching process and exacerbates the already low copper-carrying capacity of the peroxide-sulfuric acid composition. Finally, the process generates voluminous quantities of copper sulfate, which are difficult to reclaim or dispose of. It is possible to electroplate out the copper from the copper sulfate. Typically, however, this copper does not deposit as an adherent homogeneous ingot deposit, but rather comes out as a powder which sluffs off and makes recovery difficult. Brasch (U.S. Pat. No. 4,378,270) describes the use of phosphoric acid to assist in producing smooth adherent copper deposits on a cathodic surface, but this is at the expense of a slower etchant rate.

The prior art etchants are used in processes to manufacture various types of microelectronic packages such as printed circuit boards having planar resistors and laminate chip carriers. For each of these packages, complex processes must be employed to circumvent the above-mentioned problems.

There are several problems in attempting to etch fine line (less than 0.004" width) printed circuits when using classical processes and chemistry. These problems are defined as follows:

1) Fluid mechanics problems—With classical print and etch processes, a photoresist is applied to the printed circuit board. Dry film photoresist materials are generally available in thicknesses of 0.001" and greater, and typically are 0.0012" or greater. As etching progresses through the Cu, the trough defined by the photoresist and the etched Cu becomes progressively deeper and the depth to width aspect ratio becomes progressively greater. As the aspect ratio increases, the etch uniformity decreases due to the non-uniform nature of getting fresh etchant into this trough. One solution to this problem has been to use liquid resist materials that can be applied by spray or electrodeposition methods at a reduced thickness.

2) Galvanic etching—Many processors utilize a nickel/ gold plated etch mask over the copper for etching. Due to the significant difference in electrode potentials between the Au and Cu metals, the copper is etched at an accelerated, almost uncontrollable rate in currently known chemistries, except possibly for ammoniacal etchants. Galvanic etch effects can be compensated for somewhat by increasing the width of the Ni/Au resist image, such that the etched Cu image after galvanic etch effects is of the desired width. The down side to this technique is that it is not compatible with fine line/fine space etch requirements. This galvanic etch effect may also result in an undesirable line geometry after etching. Another potential solution would be to eliminate the Au, using only Ni as the etch mask. This solution would require an etchant that does not etch Ni, but does etch Cu. Until now, such an etchant has been unknown, except for chrome-sulfuric chemistries, which have their own problems of environmental impacts, waste treatment, and poor copper capacity.

3) Miscellaneous Au etch mask problems—In addition to the galvanic etch problems, Au masking suffers from very high material costs, and inability to use for innerlayer etching due to the inability to subsequently adhere epoxy to Au during composite lamination of the innerlayers.

Subtractive etching to produce fine line circuits is especially difficult for external circuit layers on plated through-hole (PTH) printed circuit boards. Prior art technology has been unable to provide uniform line widths along with high-yielding processes. This problem is primarily due to the thick photoresist that must be used to tent PTHs on printed circuit boards. Furthermore, the thickness of the photoresist layer is related to the width of area to be etched; viz., the greater the thickness of the photoresist, the greater the spacing must be between the protected circuit lines. This relationship therefore limits the density of the circuit lines if thick photoresists are necessary.

To fabricate a photoresist circuit pattern, prior art methods initially apply a thin copper foil to a substrate and then subsequently apply, image and develop a photoresist to create a circuit pattern. The exposed, thin copper foil in the through-holes is electroless and/or electrolytically plated with copper followed by a nickel-gold etch mask. The photoresist is then stripped away and the underlying thin copper foil is fast-etched while the etch mask theoretically protects the newly formed circuit lines and through-holes. This process is very difficult to control because it requires electroplating thin patterns rather than full-panel plating. Furthermore, the etching process using either peroxide-sulfuric acid or alkaline-ammonia compositions induces galvanic etching between the nickel-gold and copper interface. This is the cause of undesirable circuit line cross-sections which, in turn, creates poor functional reliability.

The use of laminate chip carriers (LCCs) in electronic packaging is growing at an ever-increasing rate. The predominant use of LCCs is with wire bond chip attachment. The use of wire bond requires that circuits be fully encapsulated in nickel-gold or other noble metallurgy. Nickel-gold both provides a wire bondable surface and prevents copper migration shorts between circuit lines in the harsh operating environment of LCCs.

The preferred metallurgy for wire bonding is electrolytically-plated nickel-gold. Due to the dense central wiring used in LCCs, temporary commoning bars must be incorporated into the central wiring area. These temporary commoning bars are then removed from the circuit after nickel-gold plating has been performed. Prior art technology currently requires applying a new photoresist layer and etching the commoning bars through openings in the photoresist, typically with a cupric chloride etch solution. The photoresist is required in order to minimize galvanic etch undercutting when copper etching occurs in the presence of nickel-gold (or other noble metals) with the above-mentioned etchant compositions—especially cupric chloride.

Since the photoresist does not completely provide protection from galvanic etching, current practice is to intentionally create a reduced opening size to compensate for the galvanic etch effects.

It is also known that application and removal of photoresist materials to and from the nickel-gold plated features can have adverse effects on wire bond yield and reliability. Hence, for wire bond LCCs it would be desirable, for the reasons discussed above, as well as for cost considerations, to have a commoning bar etchant or process that would not require a photoresist application. This can be achieved only by identifying a process that does not cause galvanic etching effects. Elimination of the galvanic etch effect will most importantly provide a superior etch profile to the fabricated circuit lines, allowing for higher quality devices.

For etching of planar resistors, an etchant must be selective to copper relative to the nickel/phosphorus (NiP) underlayer; otherwise, precise control must be maintained on the etchant chemistry and etch-process parameters, such as etch endpoint. Chromic acid compositions had been the etchants of choice due to their complete selectivity to copper, but environmental concerns have essentially precluded their use. None of the other prior art etchant compositions, including alkaline ammonia, are sufficiently selective to fabricate precision resistors. Due to this lack of selectivity, even with tight processing controls, manufacturing variability of planar resistors are typically high.

With hydrogen peroxide-sulfuric acid or alkaline-ammonium etchant compositions, there is a tendency for the copper to be etched more quickly from areas where fine lines are present than from larger areas. This results in etch mask undercutting of the fine lines while the larger areas are being cleared of copper. Furthermore, neither process is truly anisotropic. U.S. Pat. Nos. 4,497,687 and 4,545,850, both issued to N. Nelson, describe the use of nitric acid and nitric acid with sulfuric acid regenerator, respectively, to produce an anisotropic etch. But it is reported that in some instances this defect still occurs.

Etch masks can be made from various materials including plastics, ink, photoresists or a metal such as gold, solder, or a nickel-tin alloy. The mask serves the purpose of protecting the underlying material. In the case of microelectronic devices, the underlying material is typically copper. Common masks used in the prior art were solder or tin-nickel alloys. These masks effectively protected the underlying copper strata; but due to environmental concerns, they have essentially been eliminated from use. Noble metals and their alloys have alleviated the environmental problems associated with the heavy metal masks. However, in the process of etching copper using these masks, undercutting of the copper can occur at the interface of the noble metal surface and the copper surface, as described hereinabove, causing galvanic etching.

It can therefore be seen that although the process of etching copper in microelectronic packages has been performed for a lengthy period of time, many unresolved problems are still associated with the process. Some of these problems create limitations on designs of these microelectronic packages. Considering that requirements for higher circuit density, faster speed and greater reliability of these devices are constantly becoming more stringent, it is clearly understood that reduced complexity of manufacture and improved etchant performance are still required.

An etchant chemistry and associated process has now been invented to overcome all of these problems, and be able to etch fine line circuits. This etchant is not prone to the galvanic etch effects caused by Au masking, and further, does not etch Ni.

The present invention therefore provides for an etching composition useful in printed circuit board fabrication having the following independent advantages:

a) has high selectivity for copper;
    b) eliminates undercutting due to galvanic etching;
    c) has high copper carrying capacity;
    d) remains stable during its use;
    e) has wide process latitude;
    f) has high etchant rates at room temperatures;
    g) is environmentally acceptable; and
    h) does not generate toxic fumes.

The present invention further provides for processes of manufacture and designs of microelectronic packages, in particular printed circuit boards, having the following advantages:

a) printed circuit boards formed from subtractive etching having excellent fine line electrical circuit quality (i.e., uniform line widths) via a high yielding process;

b) printed circuit board intermediates utilizing thin photoresist layers, thereby fabricating printed circuit boards possessing a high density of circuits due to improved imaging resolution;

c) printed circuit board intermediates utilizing thin layers of environmentally acceptable etch masks (i.e., elimination of the use of lead solder);

d) a printed circuit board fabrication process of reduced complexity by removing the need for hole testing;

e) a process for fabricating a laminate chip carrier that has reduced complexity by eliminating the need for a second photoresist application to selectively etch commoning bars;

f) the fabrication of a laminate chip carrier that has improved wire bond yields and reliability due to elimination of the photoresist application and subsequent removal; and g) a process for fabricating PCB's having precision planar resistors.

SUMMARY OF THE INVENTION

The invention described herein is a persulfate etchant composition especially useful for dissolving a homogeneous copper during fabrication of microelectronic packages. The etchant is characterized by its ability to selectively etch copper in the presence of nickel, nickel-alloys which may be optionally overplated with noble metal alloys. Furthermore, no deleterious galvanic etching occurs in this etchant-substrate system so that substantially no accelerated etch of the copper occurs. The combination of high selectivity and lack of galvanic etch allows for a simplification of the microelectronic fabrication process and significant improvements in the design features of the microelectronic package, in particular higher density circuits. The persulfate etchant composition is stabilized with acid and phosphate salts to provide a process that is stable, fast acting, environmentally acceptable, has high capacity, and can be performed at room temperature. A preferred etchant composition is 230 gm/liter sodium persulfate, 3 volume % phosphoric acid and 0.058 molar sodium phosphate dibasic.

DETAILED DESCRIPTION OF THE INVENTION

As discussed hereinabove, the invention involves formulating a composition for etching copper. The composition has a unique combination of etchant properties. The chemicals that comprise this formulation are readily available and inexpensive. In combination, the formulation has excellent shelf life and does not pose significant environmental or safety problems. The formulation, although designed to specifically etch homogeneous copper selectively in the presence of nickel, has wide applicability in the field of fabricating microelectronic packages as seen in the examples hereinbelow. The formulations of this invention have been unexpectedly found to eliminate galvanic etching at the interface of copper and nickel surfaces. The formulations also are selective for copper in the presence of other metal etch masks such as solder (Sn/Pb).

The long-standing problem of galvanic etching has limited the designs and capabilities of the microelectronic packages and has created additional manufacturing complexity in order to circumvent this problem. An example of one type of limitation in design is where thick, oversized, photoresist layer must be used to minimize galvanic etching when cupric chloride is used to etch commoning bars.

Another example of design limitation is when, during the standard process of subtractive etching of printed circuit boards, undercutting of the nickel/copper interface causes the resultant nickel-clad copper circuit lines to have an uneven cross-section. This defect limits the minimum size of the circuit line and, in doing so, prevents the design of more dense circuits in the printed board package.

In laminate chip carriers (LCCs) where wire bond chips are attached, the circuits in this component must be encapsulated with Ni/Au. Due to the dense central wiring used in LCCs, temporary commoning bars must be incorporated into the central wiring area. These temporary commoning bars are removed after the nickel/gold plating has been performed. Prior art practices employ an application of a new photoresist layer prior to etching the commoning bar. After etching the commoning bar with $CuCl_2$, the photoresist is removed. The photoresist is used to minimize galvanic etch, but its application and removal deleteriously affects the wire bond yield and reliability, and adds to the manufacturing complexity.

The etchant composition of the present invention comprises a mixture of persulfate salt, a proton donor and a phosphate salt. The persulfate salts useful in this composition include alkali metals such as potassium and sodium, and quaternary nitrogen salts such as ammonium. The preferred alkali metal salt is sodium.

The proton donor materials useful in this invention include the strong and weak oxygen acids, examples of which include sulfuric acid, phosphoric acid, phosphorous acid, perchloric acid, perchlorous acid and water soluble organic acids such as acetic acid, carbonic acid and oxalic acid. The preferred acid is phosphoric acid. Hydrochloric acid and nitric acid cannot be utilized in the current invention due to toxic byproducts such as nitrogen oxides and chlorine gas. The concentration of proton donors is directly related to the well known parameter of pH by the equation pH=–log molar concentration of the proton donor, so that at pH=6 the molar proton concentration is $10^{-6}$; while at pH=1, the molar proton concentration is $10^{-1}$. It is seen, therefore, that minimal changes in pH actually reflect significant differences in proton donor concentration. The higher the value of the pH, the lower the concentration of the proton donor. At pH=7, neutrality is reached, wherein the proton donor solution no longer is considered to be acidic; for example, water has a pH of 7, while sulfuric acid at 0.1 molar proton concentration is pH 1. It can therefore be seen that as the pH decreases from a value of 7, there is a significantly greater safety risk due to the potential for chemical burns from strong acids. The present invention can be utilized under a wide pH range, typically from a pH of 0 to a pH of 6. Preferably, the pH of the composition should be 0.5–4 and most preferably between 1.5–3.0.

The phosphate salts useful in this composition include alkali metals such as lithium, sodium and potassium phosphate and quaternary nitrogen salts such as ammonium. Because the phosphate salt is tribasic, these salts can be either mono, dibasic or tribasic (e.g., $NaH_2PO_4$, $Na_2HPO_4$ and $Na_3PO_4$). The preferred salts are potassium and sodium phosphate dibasic. Phosphate salts have been utilized in the prior art as a protectant against corrosion; specifically with regard to steel. Phosphoric acid is also known to be added to etchant solutions on which solder (tin-lead) is employed as an etch resist. But no mention is found for the specific combination of phosphate-containing etchants in the presence of nickel. To the contrary, it has been reported that aerated phosphoric acid will corrode nickel. It is therefore an unexpected benefit that in addition to stabilizing the persulfate salt formulation, complete selectivity for etching copper in the presence of nickel is obtained.

The initial etchant composition can comprise a mixture of 10–500 gm/liter persulfate salt, up to 50 volume % of the proton donor and up to the solubility limit of the phosphate salt. If no phosphate salt is initially included, the composition will rapidly degrade during use (e.g., during the etching process). Therefore, phosphate salt must be added during the etching process. Preferred concentrations for persulfate salts are 25–400 gm/liter and most preferably 200–300 gm/liter. The preferred concentration of proton donor is 0.5% to 25% (volume %) and most preferably at 1 to 5%. Preferred concentrations for phosphate salts are 0.01–0.2 molar and most preferably 0.03–0.10 molar. The optimal concentration for phosphate is 0.058 molar. If this is not present in the initial formulation, it should be adjusted appropriately by adding a regeneration solution of phosphate to bring the working formulation to the desired phosphate concentration. This concentration has been found to unexpectedly give complete stability to the persulfate formulation without any deleterious side effects. Adjuvants such as surfactants and banking agents can also have beneficial effects for the etchant formulation. Surfactants are incorporated into the composition primarily to reduce the adhesion of air or gas bubbles to the etched surface. If this is not provided for, there is the possibility of creating irregularly-etched surfaces due to the bubbles preventing fresh etchant from contacting the component surface. Typically, surfactants can be either anionic, cationic, nonionic and inner salt types. Anionic surfactants may contain phosphate, sulfonate or sulfate groups attached to long chain alkyl or aryl moieties.

Cationic surfactants typically are quaternary ammonium salts containing a long chain alkyl or aryl moiety. Nonionic surfactants are typically composed of long chained alkyl or aryl moieties possessing polyethylene oxy functionality. Inner salt surfactants contain both anionic and cationic functionalities that are equally balanced to create a charge-neutral material. The present invention can employ all types of surfactants described above but preferably anionic and nonionic are utilized. Most preferably anionic surfactants such as Triton X 100 are utilized.

Banking agents are employed to provide greater anisotropy during the etching process. The greater the difference between the vertical and lateral etching rates, the higher is the anisotropy of the process. An ideal etching process would be one in which the vertical etch rate is significantly higher than the lateral etch rate. High lateral etch rates cause the newly formed fine line circuit lines to have non-uniform width.

A technique to improve the anisotropy of the etch is to add materials that control the surface reaction rate typically by forming a film on the vertical walls of the newly formed fine line circuit lines. These materials, called banking agents, may be either polymeric such as polyacrylamide, or hetero aromatic organic structures such as substituted or unsubstituted benzotriazole, naphthotriazole, benzofuroxan, benzothiadiazole, benzothiazole, benzoxazole and benzimidazole. The benzene nucleus of these materials can be substituted with, for example, hydroxy, alkoxy, ammio, nitro, or alkyl groups. The preferred banking agents for this invention are benzotriazoles, the most preferred being unsubstituted benzotriazole.

The etchant process is preferably performed at room temperature, but can also be performed at higher temperatures if desired. The persulfate etchant formulation is preferably applied to the component by spraying, but immersion of the component in the formulation is feasible.

The etchant formulation is specifically designed to etch copper either in the presence of nickel or nickel alloys, or overcoated with noble metals such as porous gold and palladium. It is, however, possible to use this etchant solution with other metal masks, such as solder (Sn/Pb).

PREFERRED EMBODIMENT 1

Printed Wiring Board (PWB-1)

Step 1) A copper-clad laminate is formed by taking a ½ oz copper foil and a dielectric substrate or support and placing them in direct contact and applying pressure. Examples of materials that can be used for the dielectric support include thermoplastic and thermosetting resins, ceramics, glass and composites of glass cloth reinforced or unreinforced thermoset resins, specifically phenolic resins such as ABS, polyimides such as Kapton (a Dupont trademark), polymeric vinyl chloride, and Teflon (a DuPont trademark). Preferred materials include FR4 epoxy/glass cloth, IBM Dri-clad epoxy/glass cloth, BT resins, and Teflon (Rogers 2800, and 4003).

Step 2) A photoresist material is applied by either hot roll lamination, vacuum lamination or spin coating techniques. The photoresist material can be either "negative" working (i.e. the imaged areas are hardened and unimaged areas are developed to uncover the underlying copper foil) or "positive" working (i.e. the imaged areas are softened and eventually developed to uncover the underlying copper foil). The photoresist material can be applied in liquid form from either an aqueous or solvent based formulation. The preferred materials are positive working based on phenol-aldehyde (Novolak) condensations as the binder resin and o-quinonediazide as the photoactive compound (for example EPA 914 and EL28 from McDermid Inc; Waterbury, Conn.). Additional preferred examples include Hercules CFI 1.5 (aqueous based) and DuPont T168 (solvent based), both negative acting dry film formulations.

Step 3) Imaging the photoresist is performed by using glass masters or film and exposing using electromagnetic radiation, preferably ultraviolet radiation in the spectral region from 365 to 435 nanometers. Development of the unexposed areas (negative resist system) is typically accomplished with organic solvents or aqueous solutions which dissolve the unhardened photoresist. Preferred solvents include, propylene carbonate, gamma butyrolactone, and various ester formulations. Aqueous solutions include sodium carbonate. Propylene carbonate develop is typically accomplished at 20–30 degree C., for 3–5 minutes in a spray developer at 30–40 psi spray pressure. Sodium carbonate development is typically accomplished at 80 degrees F., for 3–5 minutes in a spray developer at 15–25 psi spray pressure.

Step 4) Nickel or a nickel alloy is electroplated or electrolessly plated onto the uncovered copper surfaces that are formed during the development of the imaged photoresist.

Step 5) The remaining photoresist, having been hardened by ultraviolet exposure as described in step 3, is stripped from the copper layer. Preferred solvent strip solvents include propylene carbonate and benzyl alcohol. The preferred aqueous solvent is sodium hydroxide. Solvent stripping in propylene carbonate is typically accomplished at 90–105 degrees C., for 5–8 minutes in a spray stripper at 50–60 psi spray pressure. Aqueous stripping is typically accomplished at 135–145 degrees F., for 5–8 minutes in a spray stripper at 20–30 psi spray pressure.

Step 6) The unplated copper is etched leaving the nickel-plated copper circuit patterns. The preferred etchant solution containing 230 gm/liter sodium persulfate, 3 volume percent phosphoric acid and 0.058 Molar sodium phosphate dibasic. Etching is preferably performed in a spray etcher at 30–40 degrees C. with a 20–30 psi spray pressure. The etch rate under these conditions is approximately 0.001 inches per minute. The resulting circuit lines have a copper thickness of 17–38 microns, depending on starting foil thickness, with a nickel overplating of 2–5 microns.

PREFERRED EMBODIMENT 2

Printed Wiring Board (PWB-2)

Steps 1 through 6 for the manufacture of PWB-2 are the same as in Preferred Embodiment 1.

Step 7) A second dielectric is applied to the uppermost. surface of Preferred Embodiment 1 which substantially covers the nickel-plated circuit patterns and exposed areas of the support dielectric material. The second dielectric material can have a composition that is same or different from the dielectric support material. This second dielectric can be used as either a liquid, dry film or glass reinforced format. The second dielectric can also have the properties of being photoimageable or a soldermask or both. A preferred photoimageable and soldermask material is IBM ASM/Morton LB-404 described in U.S. Pat. Nos. 5,026,624 to Day, et. al, issued Jun. 25, 1991; U.S. Pat. No. 5,300,402 to Card, et. al., issued Apr. 5, 1994 and U.S. Pat. No. 5,264,325 to Allen, et. al., issued Nov. 23, 1993. Other preferred materials that can be used as a photoimageable dielectric or a dielectric soldermask, or both include: Taiyo PSR-4000-AUS5; DuPont Vacrel and DuPont Vialux. Applied thicknesses of these materials is typically 0.001 to 0.003 inches (25–75 micron). Preferred glass cloth reinforced epoxy materials include IBM Dri-clad, FR 2414, or BT resins in thicknesses from 0.002 to 0.010 inches.

PREFERRED EMBODIMENT 3

Printed Wiring Board (PWB-3)

Steps 1 through 7 in the manufacture of PWB-3 are the same as for Preferred Embodiment 2. Manufacture of PWB-3 comprises an additional step, step 8.

Step 8) Applying a conductive layer to the upper surface of the second dielectric. This second conductive layer can be applied with several techniques. A preferred embodiment, particularly with glass cloth reinforced epoxy materials, or unreinforced epoxy adhesive materials is to laminate a copper foil material ½ oz (0.007 inches) to 1 oz (0.0014 inches) under heat and pressure to the second dielectric layer. Depending on the dielectric material used, lamination can be performed at temperatures from 125 to 200 C, for 1 to 3 hours with 100 to 500 psi pressure. A second embodiment involves chemically roughening the dielectric surface, followed by seeding and plating of the second conductive layer.

PREFERRED EMBODIMENT 4

Printed Wiring Board (PWB-4)

Steps 1 through 8 are the same as for Preferred Embodiment 3. Manufacture of PWB-4 comprises an additional step, step 9.

Step 9) Connecting the exterior conductive layer from step 8 of Preferred Embodiment 3 with the patterned nickel-plated copper circuitry from step 6 of Preferred Embodiment 3 by drilling and plating of through holes.

PREFERRED EMBODIMENT 5

Printed Wiring Board (PWB-5)

Another preferred embodiment of the present invention contemplates using a photoimageable dielectric as described in preferred Embodiment 2, step 7 and imaging and developing the photoimageable material.

The manufacture of the embodiment of PWB-5 comprises steps 1 through 7 of Preferred Embodiment 2 and an additional step, step 8.

Step 8) Expose and develop the photoimageable dielectric layer to form photovias to uncover the underlying nickel-plated copper circuitry. In a preferred embodiment for carrying out this aspect of the invention, IBM ASM/Morton LB-404 dielectric material is used. This is a dry film format, negative working material, with a thickness of 0.001–0.003 inches. The ASM material is particularly sensitive to ultraviolet radiation from 320 to 365 nanometers. Selected portions to be developed away, are protected from exposure by the film mask, while the remaining areas of the dielectric are being exposed at an intensity of 1–2 Joules/square centimeter. After exposing and post exposure baking at approximately 125 C for 30 minutes, the unexposed areas are developed away using propylene carbonate (PCO3) at 50 degrees C., for 3 to 5 minutes in a spray developer with 50–60 psi spray pressure. Photovias range from 0.003 to 0.010 inches in diameter. The imaged dielectric material is then cured by UV bump exposing to approximately 4 Joules per square centimeter intensity, and baking at approximately 180 degrees C. for 1 hour.

PREFERRED EMBODIMENT 6

Printed Wiring Board (PWB-6)

Another preferred embodiment of the present invention comprises applying, to the printed wiring board PWB-5, a conductive layer over the photovias and remaining discontinuous second dielectric layer. The conductive layer may be composed of the same or different materials as the underlying nickel-plated copper circuitry.

Steps 1 through 8 of the manufacture of this embodiment are the same as steps 1 through 8 of Preferred Embodiment 5. An additional step, step 9, is required to manufacture PWB-6.

Step 9) Roughen the top surface of the second dielectric layer, then follow by seeding and Cu plating the second conductive layer. In a preferred embodiment, the dielectric is chemically roughened by immersion in a commercially available permanganate hole cleaning material which will preferably etch the dielectric material. Other methods of roughening include mechanical abrasion or plasma etching. Seeding is performed by either commercially available palladium seed chemistries or sputter deposition of copper or chrome/copper. Seeding is followed by either flash electroless copper plating and acid copper electroplating or full electroless copper plating. Plating can occur over the entire surface of the substrate, followed by standard subtractive etching to define circuit lines, or it can be pattern plated whereby a resist is applied and imaged to the seeded surface, and plating then occurs only in the resist openings. In either method, the finished plated copper thickness can be from 0.0005 to 0.0015 inches.

PREFERRED EMBODIMENT 7

Printed Wiring Board (PWB-7)

Another preferred embodiment of the present invention contemplates using an organic solder mask as the material of the second dielectric layer as described in step 7 of Preferred Embodiment 2.

Steps 1 through 6 of the manufacture of PWB-7 are the same as steps 1 through 6 of Preferred Embodiment 2.

Step 7) The same as step 7 in Preferred Embodiment 2 except that the second dielectric is a solder mask material. The preferred soldermask material is IBM ASM/Morton LB404, which is applied from 0.0005 to 0.003 inches in thickness, by either vacuum lamination of a dry film material, or screen printing or curtain coating of a liquid formulation of the material. Other commercially available soldermask materials can be used equally as well. Alternative materials include Taiyo PSR-4000-AUS5 or Probimer liquid materials and DuPont Vacrel dry film material.

Step 8) Expose and develop the solder mask material to uncover the underlying nickel-plated copper circuits. Processing of IBM ASM is the same as described in PWB-5, step 8. Of the alternative soldermask materials described in step 7, Probimer is solvent developable and as such is processed in a similar manner as IBM ASM material. Taiyo-4000-AUS5 and DuPont Vacrel are aqueous developable materials and are processed similarly as IBM ASM except for development which is done in a sodium carbonate solution.

Step 9) Immersion and/or electrolessly plate gold onto the uncovered porions of the nickel-plated copper circuits where the soldermask material has been developed away. This provides a unique opportunity for material savings as the gold is only plated in the soldermask openings where it is required. Plating the nickel prior to soldermask application also provides for improved adhesion of the soldermask to the circuit lines, and does not expose the soldermask to the harsh chemistry and temperature of the nickel plating process.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A process of etching copper on a printed circuit board wherein said circuit board is placed in contact with an etchant formulation comprising 10–500 gm/liter of an alkali metal or ammonium persulfate salt; up to 50 volume % of a solution containing a proton donor; and up to the solubility limit gm/liter of a phosphate salt; and during the time of contact, a sodium phosphate dibasic solution is continuously added to refresh and maintain a 0.058 M sodium phosphate dibasic concentration in said etchant solution, said process being performed at temperatures from ambient to 50° C.

2. The process of etching copper on a printed circuit board as described in claim 1, wherein contact is achieved by immersing said printed circuit board into a liquid solution of said etchant formulation.

3. The process of etching copper on a printed circuit board as described in claim 1, wherein contact is achieved by spraying said etchant formulation onto said printed circuit board.

4. The process of etching copper on a printed circuit board as described in claim 1, wherein said etchant formulation further comprises a surfactant.

5. The process of etching copper on a printed circuit board as described in claim 1, wherein said etchant formulation further comprises a banking agent.

6. A process of etching copper on a printed circuit board, wherein said printed circuit board is placed in contact with an etchant formulation comprising about 10–500 gm/liter of an alkali metal or ammonium persulfate salt; up to about 50 volume % of a solution containing a proton donor; and up to the solubility limit gm/liter of a phosphate salt; wherein said printed circuit board comprises a plated metal mask over-coating said copper.

7. The process of etching copper as described in claim 6, wherein said plated metal mask comprises a nickel or nickel alloy.

8. The process of etching copper as described in claim 6, wherein said plated metal mask comprises an electrolessly plated tin.

9. The process of etching copper as described in claim 7, wherein said plated nickel or nickel alloy is further over-plated with a noble metal.

10. The process of etching copper as described in claim 9, wherein said noble metal comprises gold or palladium.

11. A process of fabricating a planar resistor by selectively etching a copper layer on a printed circuit board using an etchant formulation comprising about 10–500 gm/liter of an alkali metal or ammonium persulfate salt; up to about 50 volume % of a solution containing a proton donor; and up to the solubility limit gm/liter of a phosphate salt; wherein said printed circuit board comprises a thin nickel base layer interposed between said copper layer and a printed board substrate.

12. The process of etching copper on a printed circuit board as described in claim 11, wherein said thin Ni base layer comprises pure nickel or a nickel alloy.

13. A process of etching copper on a printed circuit board wherein said copper is selectively etched from an invar base layer of said printed circuit board with an etchant formulation comprising about 10–500 gm/liter of an alkali metal or ammonium persulfate salt; up to about 50 volume % of a solution containing a proton donor; and up to the solubility limit gm/liter of a phosphate salt.

14. A printed circuit board containing a planar resistor fabricated by the process comprising steps of:
   a) applying a photoresist to an etched copper over nickel or nickel/phosphorus pattern;
   b) exposing and developing a planar resistor pattern in said photoresist;
   c) selectively etching the copper from above the nickel or nickel/phosphorus by contacting with the formulation of 230 gm/liter sodium persulfate, 3 volume % phosphoric acid and 0.058 M sodium phosphate dibasic; and
   d) removing said photoresist.

15. A method for fabricating a printed wiring board comprising the steps of:
   a) applying a thin photoresist to a copper clad dielectric support;
   b) exposing imagewise and then developing the photoresist to prepare a copper circuit pattern;
   c) electrolytically or electrolessly plating nickel or nickel alloy over the exposed copper circuit pattern surfaces;
   d) removing by stripping the remaining photoresist to uncover the unplated copper surface;
   e) chemically etching the unclad copper areas using a formulation comprising 230 gm/liter sodium persulfate, 3 volume % phosphoric acid and 0.058 molar sodium phosphate dibasic to generate nickel-plated copper circuit patterns; and f) applying a second dielectric layer to substantially cover the nickel or nickel alloy plated copper wire circuitry.

16. The method for fabricating a printed wiring board as recited in claim 15, further comprising the step of:

g) applying a conductive layer to the upper surface of said second dielectric layer.

17. The method for fabricating a printed wiring board as recited in claim 15, further comprising the step of:

g) applying a conductive layer to the upper surface of said second dielectric layer and coupling the underlying nickel-plated copper circuit pattern thereto by providing suitable drilled or plated through holes or photovias through said conductive and second dielectric layers.

18. The method for fabricating a printed wiring board as recited in claim 15, wherein second dielectric is photoimageable, and further comprising the step of:

g) imagewise exposing and then developing the second dielectric layer to uncover portions of the underlying nickel-plated copper circuit patterns.

19. The method for fabricating a printed wiring board as recited in claim 18, further comprising the step of:

h) electroplating a second conductive layer onto the upper surfaces of said second dielectric and the uncovered nickel or nickel alloy plated copper circuitry.

20. The method for fabricating a printed wiring board as recited in claim 15, wherein said second dielectric is an organic soldermask material, and further comprising the steps of:

g) imaging and developing said dielectric soldermask; and h) plating gold onto said nickel or nickel alloy plated copper circuits in areas where said dielectric soldermask has been removed.

* * * * *